(12) United States Patent
Miya

(10) Patent No.: US 7,373,736 B2
(45) Date of Patent: May 20, 2008

(54) SUBSTRATE PROCESSING APPARATUS AND METHOD WITH PROXIMITY GUIDE AND LIQUID-TIGHT LAYER

(75) Inventor: Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 248 days.

(21) Appl. No.: 11/396,724

(22) Filed: Mar. 28, 2006

(65) Prior Publication Data

US 2006/0218815 A1 Oct. 5, 2006

(30) Foreign Application Priority Data

Mar. 30, 2005 (JP) ............................. 2005-097438
Jan. 10, 2006 (JP) ............................. 2006-002223

(51) Int. Cl.
*F26B 3/00* (2006.01)
(52) U.S. Cl. ............................................. 34/443; 34/90
(58) Field of Classification Search .................. 34/443, 34/90; 134/902
See application file for complete search history.

(56) References Cited

U.S. PATENT DOCUMENTS 3,950,184 A * 4/1976 Adams et al. ................. 134/10
5,871,584 A * 2/1999 Tateyama et al. ............ 118/323
6,073,369 A * 6/2000 Yasuyuki ...................... 34/651
6,446,358 B1 9/2002 Mitsumori et al.
6,858,092 B2 * 2/2005 Langen .......................... 134/33
7,279,044 B2 * 10/2007 Park et al. ................... 118/323

FOREIGN PATENT DOCUMENTS

| JP | 7-29866 | 1/1995 |
|---|---|---|
| JP | 2922754 | 4/1999 |
| JP | 2001-33165 | 2/2001 |
| JP | 2003-31545 | 1/2003 |
| JP | 2003-151947 | 5/2003 |
| JP | 2004-335840 | 11/2004 |

* cited by examiner

*Primary Examiner*—S. Gravini
(74) *Attorney, Agent, or Firm*—Ostrolenk, Faber, Gerb & Soffen, LLP

(57) ABSTRACT

A proximity member moves in a moving direction (−X) in a condition that an opposed surface of the proximity member is disposed in the vicinity of a substrate surface and that a liquid-tight layer is formed between the opposed surface and the substrate surface, and nitrogen gas is discharged toward an upstream-side interface of the liquid-tight layer from the upstream side (+X) to the proximity member in the moving direction. Thus discharged nitrogen gas is blown selectively and in concentration against an exposed interface portion, a rinsing liquid forming the exposed interface portion is blown away from the substrate surface and the liquid-tight layer, and a substrate surface region which corresponds to the exposed interface portion is dried.

13 Claims, 7 Drawing Sheets

FIG. 3A : ENLARGED CROSS SECTIONAL VIEW OF DRIER HEAD
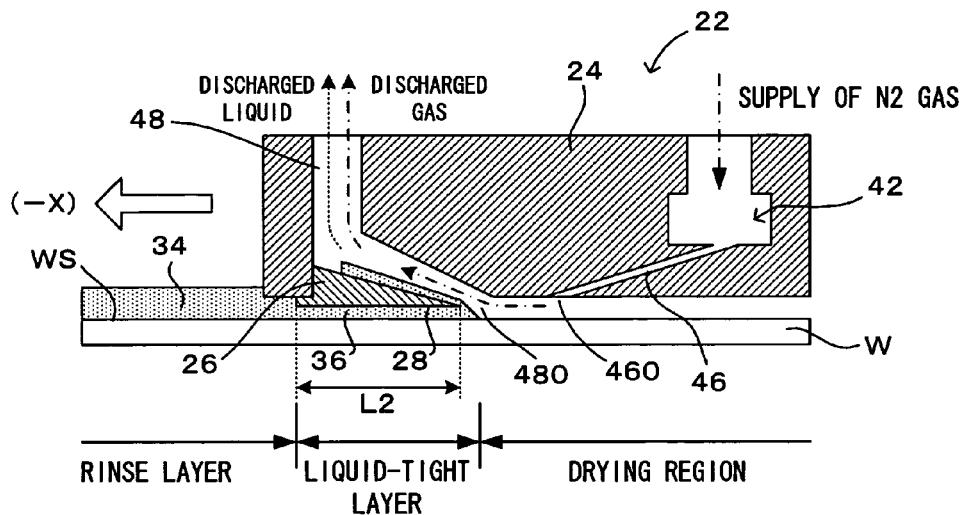
FIG. 3B : PARTIAL PERSPECTIVE VIEW OF PROXIMITY MEMBER
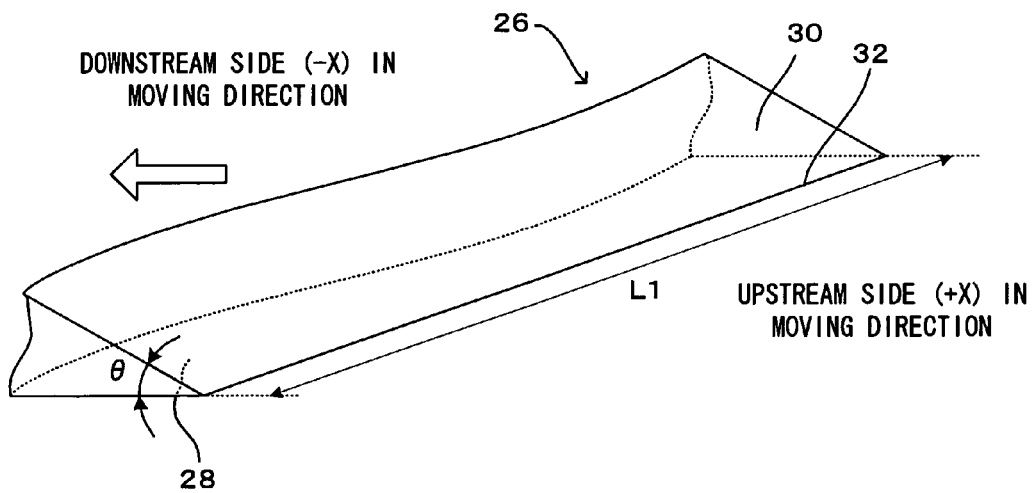

FIG. 4A : BEFORE MOVING OF DRYER HEAD
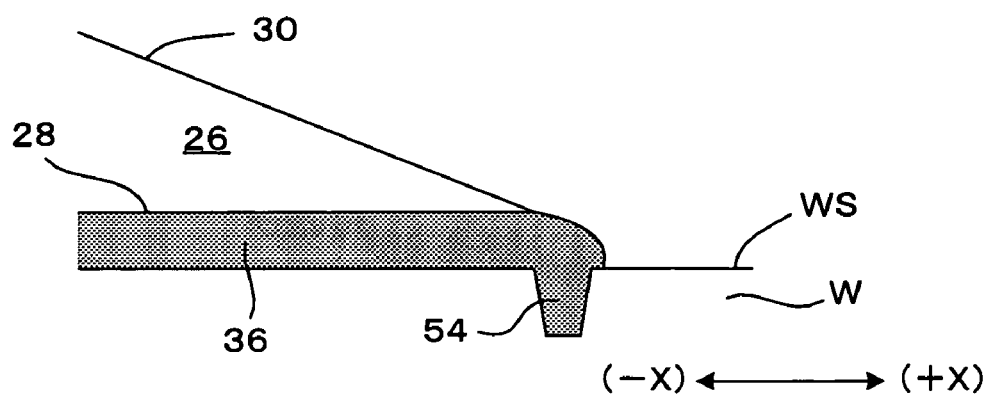
FIG. 4B : AFTER MOVING OF DRYER HEAD
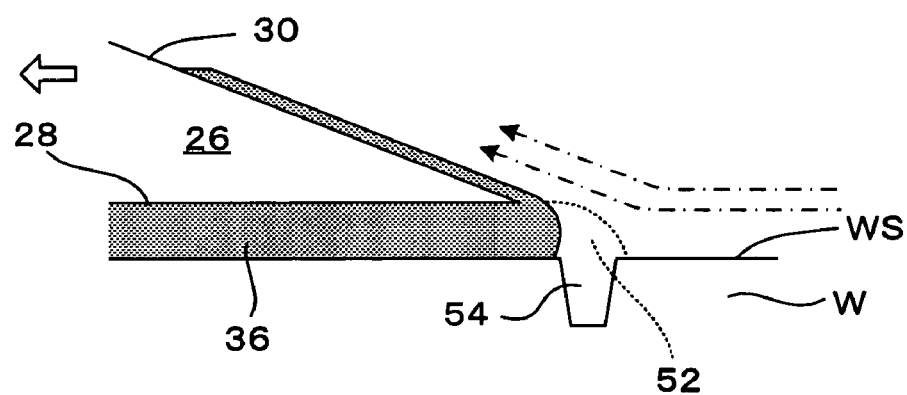

SUBSTRATE PROCESSING APPARATUS AND METHOD WITH PROXIMITY GUIDE AND LIQUID-TIGHT LAYER

BACKGROUND OF THE INVENTION

1. Field of the Invention

The present invention relates to a substrate processing apparatus for and a substrate processing method of drying a surface of a substrate which is wet with a liquid. Substrates to be dried include semiconductor wafers, glass substrates for photomask, glass substrates for liquid crystal display, glass substrates for plasma display, substrates for optical disks, etc.

2. Description of the Related Art

In a process of manufacturing a semiconductor apparatus, a liquid crystal display apparatus or the like, after cleaning with a processing liquid and rinsing with a rinsing liquid which may be pure water or the like, so-called spin drying is often performed for the purpose of removing the rinsing liquid adhering as a liquid film to the top surface of a substrate. As the spin drying, the processing described in Japanese Patent No. 2922754 or JP-A-2003-31545 is known for instance.

A substrate processing apparatus which executes such drying includes a chuck which holds a substrate horizontally on its top surface. The chuck is supported for free rotations about a vertical axis, and a rotation drive mechanism drives the chuck into rotations. Further, there is an upper-side blow nozzle above the chuck. An outlet at the tip of the upper-side blow nozzle is disposed in the vicinity of and opposed against a central area of the top surface of a substrate which is held by the chuck. Hence, it is possible to blow drying air toward the central area of the top surface of the substrate from right above. Describing in more detail, drying air is blown from the outlet at the tip of the upper-side blow nozzle toward a central section of the surface of the substrate whose surface is wet with a liquid which may be a rinsing liquid or the like. As a result, a circular liquid-deprived part (hole) appears in the central area of the surface of the substrate, and this part is dried. The rotation drive mechanism thereafter activates the chuck, the substrate accelerates its rotations up to a predetermined number of revolution, and the liquid on the substrate is mostly removed while the substrate rotates at a low speed. After this, the number of revolution is increased further, the substrate rotates at a high speed, and the substrate is drained off of the still remaining liquid and dried.

SUMMARY OF THE INVENTION

However, depending upon the condition of a surface of a substrate, drops of a liquid may remain after spin drying and may generate a water mark. For example, in a substrate such as a substrate with a pattern formed on its surface, a substrate with a hydrophilic area and a hydrophobic area are mixedly present on its surface, and a substrate with a bump formed on its surface, drops are prone to remain, which may lead to a problem that a trouble occurs due to a generation of a water mark, a quality of a product deteriorates and a production yield decreases.

Over the recent years, micro patterns formed on a surface of a substrate become rapidly finer, which have given rise to a new problem in substrate processing. More specifically, during drying a substrate, an interface between a liquid and a gas appears on a substrate with a progress of drying, and if the interface appears in a gap between the micro patterns, a problem arises that the micro patterns are pulled each other due to a surface tension of the liquid and are destroyed.

The invention has been made in light of the problems above, and accordingly, an object of the invention is to provide a substrate processing apparatus and a substrate processing method with which it is possible to dry a surface of a substrate favorably while preventing generation of a water mark on the surface of the substrate during drying of the surface of the substrate which is wet with a liquid, and while preventing destruction of micro patterns which are formed on the surface of the substrate.

According to a first aspect of the present invention, there is provided a substrate processing apparatus which dries a surface of a substrate which is wet with a liquid, comprising: a proximity member which includes an opposed surface disposed facing the surface of the substrate but away from the surface of the substrate and which is structured to move freely and relatively to the substrate in a predetermined moving direction in a condition that a space between the opposed surface and the surface of the substrate is filled with the liquid to form a liquid-tight layer; a driver which moves the proximity member relatively to the substrate in the moving direction; and a gas discharger which discharges a drying gas which dries the surface of the substrate, wherein the proximity member further includes a guide surface which is connected with an upstream side portion, which is located on the upstream side in the moving direction among side portions defining the opposed surface, and which extends from the position of connection with the upstream side portion in a direction away from the surface of the substrate overlooking the upstream side in the moving direction, and the gas discharger, in the moving direction, is disposed on the upstream side relative to the proximity member and discharges the drying gas toward an upstream-side interface of the liquid-tight layer.

According to a second aspect of the present invention, there is provided a substrate processing method of drying a surface of a substrate which is wet with a liquid, comprising the steps of: arranging a proximity member which includes an opposed surface which faces the surface of the substrate and a guide surface to a position at which the opposed surface is away from the surface of the substrate, the guide surface being connected with an upstream side portion which is located on an upstream side in a predetermined moving direction among side portions defining the opposed surface and extending from the position of connection with the upstream side portion in a direction away from the surface of the substrate overlooking the upstream side in the moving direction; forming a liquid-tight layer by filling up a space between the opposed surface and the surface of the substrate with the liquid; moving the proximity member in the moving direction relative to the substrate while maintaining the condition that the liquid-tight layer is formed; and discharging a drying gas to dry the surface of the substrate toward an upstream-side interface of the liquid-tight layer from the upstream side relative to the proximity member in the moving direction.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 3A is an enlarged cross sectional view of a drier head;

FIG. 3B is a partial perspective view of a proximity member;

FIGS. 4A and 4B are schematic drawings which show an operation of the drying apparatus of FIG. 2;

DETAILED DESCRIPTION OF THE PREFERRED EMBODIMENTS

First Embodiment

Figure 1:
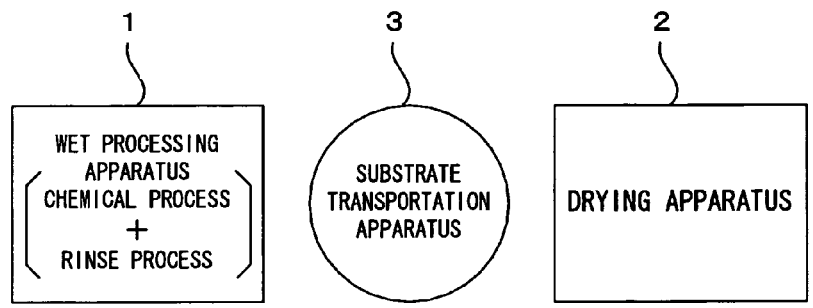
FIG. 1 is a plan layout drawing of a substrate processing system which is equipped with a first embodiment of a substrate processing apparatus according to the invention.

FIG. 1 is a plan layout drawing of a substrate processing system which is equipped with a first embodiment of a substrate processing apparatus according to the invention. In this substrate processing system, a wet processing apparatus 1, which chemically processes and rinses a surface of a substrate, is disposed over a certain distance from a drying apparatus 2 which corresponds to the substrate processing apparatus according to the invention and which is an apparatus which dries a substrate whose surface is wet with a liquid such as a rinsing liquid, and there is a substrate transportation apparatus 3 disposed between these two. Of these apparatuses, the wet processing apparatus 1 is an apparatus which, after supplying a chemical solution to a surface of a substrate and accordingly cleaning the surface of the substrate, supplies a rinsing liquid which may be pure water or DIW (deionized water) to the surface of the substrate and performs rinsing. The substrate transportation apparatus 3 thereafter transports the substrate thus finally rinsed by the wet processing apparatus 1 to the drying apparatus 2 which will then execute drying. As described above, in this embodiment, wet processing and drying are separated from each other, the substrate transportation apparatus 3 unloads from the wet processing apparatus 1 a substrate whose surface is wet with the rinsing liquid, and feeds the substrate as it is wet with the rinsing liquid to the drying apparatus 2. The wet processing apparatus 1 and the substrate transportation apparatus 3 are conventional apparatuses very often used, their structures and operations will not be described. On the other hand, the drying apparatus 2 corresponds to the first embodiment of the substrate processing apparatus according to the invention and has the following characteristics which will now be described in detail with reference to the associated drawings.

Figure 2:
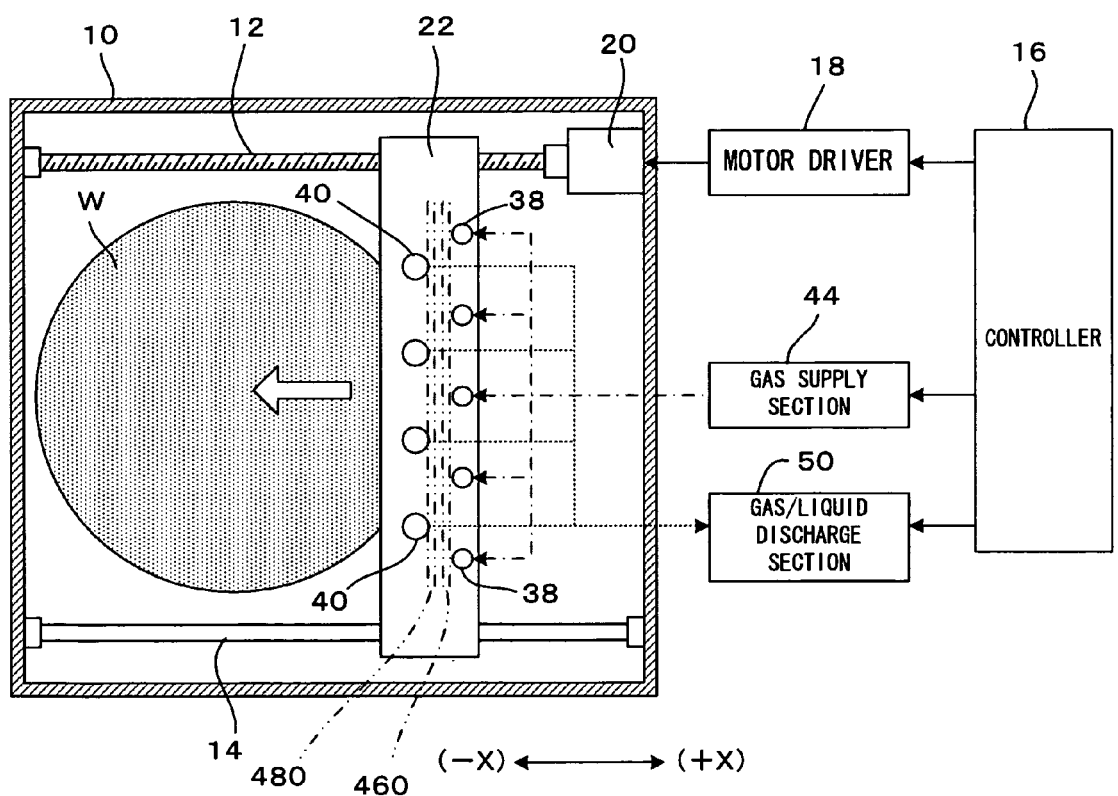
FIG. 2 is a plan view which shows a structure of a drying apparatus which represents the first embodiment of the invention.

FIG. 2 is a plan view which shows a structure of the drying apparatus which is the first embodiment of the substrate processing apparatus according to the invention. FIG. 3 is a partially expanded view of the drying apparatus of FIG. 2. More specifically, FIG. 3A is an enlarged cross sectional view of a drier head, and FIG. 3B is a partial perspective view of a proximity member. In the drying apparatus 2, a substrate holding stage (not shown) is disposed inside an apparatus main body 10 so that it is possible to hold a substrate W approximately horizontally with a substrate surface WS directed toward above. Also disposed inside the apparatus main body 10 are a ball screw 12 and a guide shaft 14 which are positioned parallel to each other so as to sandwich the substrate W which is held by the substrate holding stage. Of these, the ball screw 12 extends in the horizontal direction X as shown in FIG. 2. A motor driver 18 drives a motor 20 in response to an operation command received from a controller 16 which controls the whole of the apparatus, and the ball screw 12 rotates as the motor is driven. It is therefore possible to reciprocally move in the horizontal direction X a drier head 22 whose one end is threadably mounted on the ball screw 12. The motor driver 18 and the motor 20 thus function as the "driver" of the invention. The guide shaft 14 is fixed to the apparatus main body 10, and is inserted into the other end of the drier head 22. Hence, the guide shaft 14 guides and supports the drier head 22 so that the drier head 22 is capable of stably moving in the horizontal direction X. Further, in this embodiment, drying which will be described later is performed with the drier head 22 moving to the left-hand side (−X) in FIG. 2 in the horizontal direction X. This horizontal direction (−X) corresponds to the "predetermined moving direction" of the invention, and the horizontal direction (−X) will now be referred to simply as the "moving direction".

As shown in FIG. 3, the drier head 22 includes a head main body 24 and a proximity member 26 which is made of quartz and which is attached on a bottom surface side of the head main body 24 at a downstream side in the moving direction. The proximity member 26 is a triangle pole in shape whose vertical cross section is shaped approximately like a right angled triangle, and one side surface 28 of the proximity member 26 serves as an opposed surface which faces the substrate surface WS which is wet with the rinsing liquid. Other side surface 30 is a surface which is located on the upstream side (+X) in the moving direction and directed toward above. Describing in more detail, the side surface 30 is connected with an upstream side portion 32 which is one of side portions defining the opposed surface 28 and which is located on the upstream side (+X) in the moving direction, and the side surface 30 extends from this connection position in a direction away from the substrate surface WS overlooking the upstream side (+X) in the moving direction. The side surface 30 corresponds to the "guide surface" of the invention. The length L1 of the proximity member 26 in a direction orthogonal to the moving direction is, in this embodiment for example, the same as a diameter of the substrate W. In addition, the length L1 may be longer than the diameter of the substrate W in some degree.

Further, at the upstream-side end of the proximity member 26, the opposed surface 28 and the guide surface 30 are at the acute angle θ. This angle θ is set such that it is possible for the rinsing liquid blown away by nitrogen gas to flow upward along the guide surface 30 as described later, and that it is possible to form that the length L2 of the proximity member 26 in the moving direction can be set to such a length (in this embodiment for example, 50 mm) which secures a strength of the structure. The acute angle θ is, in this embodiment for example, from 5 to 30 degrees, or preferably 15 degrees.

With the proximity member 26 having the above-described structure disposed so that its opposed surface 28 is slightly off the substrate surface WS, a part of the rinsing liquid which forms a rinse layer 34 adhering as a puddle to the substrate surface WS entirely fills up the space between the opposed surface 28 and the substrate surface WS due to the capillary phenomenon and forms a liquid-tight layer 36. In this embodiment, the drier head 22 is disposed so as to form the liquid-tight layer 36 as described above.

One or plural (five in the embodiment shown in FIG. 2) gas supply ports 38 are attached on the upstream side in the moving direction to the top surface of the drier head 22, and one or plural (four in the embodiment shown in FIG. 2) gas/liquid discharge ports 40 are attached on the downstream side to the top surface of the drier head 22. These gas supply ports 38 are communicated with an air reservoir 42 formed inside the head main body 24. Activated in accordance with an operation command from the controller 16, a gas supply section 44 supplies the nitrogen gas as a drying gas to the air reservoir 42. Further, through a narrow tube part 46 which extends diagonally downward from the air reservoir 42, the nitrogen gas is discharged toward the upstream-side end of the proximity member 26. A discharge outlet 460 from which the nitrogen gas in the narrow tube part 46 is discharged toward the upstream-side end of the proximity member 26 has a shape of a slit. The length of this discharge outlet 460 in the direction orthogonal to the moving direction of the proximity member 26 is equal to the length L1 of the proximity member 26 in this direction and equal to the diameter of the substrate W in this embodiment. Hence, the nitrogen gas is discharged toward the upstream-side interface of the liquid-tight layer 36 which is formed between the proximity member 26 and the substrate surface WS as described above, and the upstream-side interface of the liquid-tight layer 36 is blown away and drying is accordingly achieved as described later in detail. In this embodiment, the head main body 24 equipped with the air reservoir 42 and the narrow tube part 46 thus has a function of the "gas discharger" of the invention.

Further, in this embodiment, for the purpose of discharging the rinsing liquid and the nitrogen gas thus blown away from the drier head 22, as shown FIG. 3A, the head main body 24 has a discharge hole 48 corresponding to the guide surface 30 of the proximity member 26. An opening 480 which is opened toward the substrate surface WS at the bottom of the discharge hole 48 has a shape of a slit. The length of this opening 480 in the direction orthogonal to the moving direction of the proximity member 26 is equal to the length L1 of the proximity member 26 in this direction and equal to the diameter of the substrate W. An upper part of the discharge hole 48 (the upper part in the drawing) extends straight up and is communicated with the gas/liquid discharge ports 40, while a lower part of the discharge hole 48 (the lower part in the drawing) is bent toward the upstream side (+X) in the moving direction. The cross sectional shape of the discharge hole 48 is approximately like a boot, that is, resembles the letter "L" of which the bending angle is an obtuse angle. Hence, the nitrogen gas discharged from the narrow tube part 46 flows along the guide surface 30 via the upstream-side interface of the liquid-tight layer 36, and is collected by a gas/liquid discharge section 50 through the discharge hole 48 and the gas/liquid discharge ports 40. Meanwhile, the rinsing liquid blown away by the nitrogen gas discharged from the narrow tube part 46 also travels along the guide surface 30 and away from the substrate surface WS and the liquid-tight layer 36, and is collected by the gas/liquid discharge section 50 through the discharge hole 48 and the gas/liquid discharge ports 40 by the flow of the gas.

A drying operation in the drying apparatus 2 having the structure above will now be described. The rinsing liquid adheres to the surface of the substrate W finally rinsed by the wet processing apparatus 1, and there is the puddle-like rinse layer 34. The substrate transportation apparatus 3 transports the substrate W which is wet with the rinsing liquid as it is onto the substrate holding stage of the drying apparatus 2. After the substrate W is held on the substrate holding stage, the controller 16 controls the respective parts of the apparatus and drying is performed. More specifically, the motor driver 18 drives the motor 20 and the drier head 22 moves in the moving direction (−X), the gas supply section 44 is activated and the nitrogen gas, as the drying gas, is discharged from the tip end of the narrow tube part 46.

The rinsing liquid (liquid) fills up the space between the opposed surface 28 and the substrate surface WS to form the liquid-tight layer 36. When the proximity member 26 moves in the moving direction (−X) from the condition shown in FIG. 4A to the condition shown in FIG. 4B for example, the upstream-side interface of the liquid-tight layer 36 in the moving direction comes off from the proximity member 26 and is exposed. The nitrogen gas (drying gas) discharged from the narrow tube part 46 is blown against the interface portion thus exposed, namely, the exposed interface portion 52, the rinsing liquid forming the exposed interface portion 52 is consequently blown away off from the substrate surface WS and the liquid-tight layer 36, and a substrate surface region corresponding to the exposed interface portion 52 is dried. The substrate surface region dried in this fashion spreads as the proximity member 26 moves, and the entire substrate surface WS is dried when the proximity member 26 scans the entire surface of the substrate.

As described above, according to this embodiment, with the condition that the liquid-tight layer 36 is formed by bringing the proximity member 26 close to the substrate surface WS, the proximity member 26 moves in the moving direction (−X) and the nitrogen gas (drying gas) is ejected toward the upstream-side interface of the liquid-tight layer 36 from the upstream side (+X) of the proximity member 26 in the moving direction. Hence, the nitrogen gas is sprayed on the exposed interface portion 52 selectively and in concentration, and the substrate surface region which is opposed against the exposed interface portion 52 is dried. As a result, it is possible to dry the substrate surface region without generating liquid drops and to prevent without fail generation of a water mark in this substrate surface region.

Further, in the embodiment above, since the proximity member 26 is attached to the head main body 24, the distance between the discharge position of the nitrogen gas (the tip end of the narrow tube part 46) and the upstream-side interface of the liquid-tight layer 36 is fixed. Hence, the proximity member 26 and the head main body 24 move as one unit while staying apart from each other over this distance when driven by the motor 20 and the physical properties (the flow rate, the flow volume, etc.) of the nitrogen gas blown against the exposed interface portion 52 stabilize. As a result, stable and favorable drying is executed. As a matter of course, the proximity member 26 and the head main body 24 may be structured so that they move independently. However, two drive mechanisms will be required in that case. On the contrary, according to this embodiment, the proximity member 26 and the head main body 24 are driven by the single motor 20, hence, it is possible to simplify the drive structure.

Further, even when micro patterns 54 are formed in the substrate surface region as shown in FIGS. 4A and 4B, it is possible to dry and remove the rinsing liquid which has entered the micro patterns 54 by means of the nitrogen gas (drying gas) in an extremely short period of time, and therefore, it is possible to effectively prevent destruction of the patterns. This is because, in this embodiment, since a region which the nitrogen gas can dry is limited to the exposed interface portion 52 as described above, the substrate surface region which corresponds to the exposed interface portion 52 is dried immediately.

Further, the nitrogen gas from the narrow tube part 46 moves away from the substrate surface WS along the guide surface 30 as denoted at the dotted-and-dashed line in FIG. 4B, thereby forming a gas flow which is along the guide surface 30. The rinsing liquid blown away from the substrate surface WS by the nitrogen gas, due to the gas flow, moves further away from the substrate surface WS and is collected without fail by the gas/liquid discharge section 50 through the discharge hole 48 and the gas/liquid discharge ports 40. This effectively prevents the rinsing liquid blown away by the nitrogen gas from returning back to the substrate surface WS again. In addition, since the entire proximity member 26 is made of quartz in this embodiment, the guide surface 30 is hydrophilic to the rinsing liquid and the rinsing liquid blown away by the nitrogen gas moves along the guide surface 30 toward the gas/liquid discharge ports 40, which securely discharges the rinsing liquid. Further, the upstream-side end of the proximity member 26 is formed so that the opposed surface 28 and the guide surface 30 are at the acute angle θ, which feature is advantageous in terms of discharge of the rinsing liquid and the nitrogen gas. More specifically, since the guide surface 30 is at the acute angle θ with respect to the opposed surface 28, the nitrogen gas blown against the exposed interface portion 52 and the rinsing liquid blown away by the nitrogen gas are guided efficiently toward the gas/liquid discharge ports 40 via the guide surface 30 and collected by the gas/liquid discharge section 50 without fail.

Second Embodiment

Figure 5:
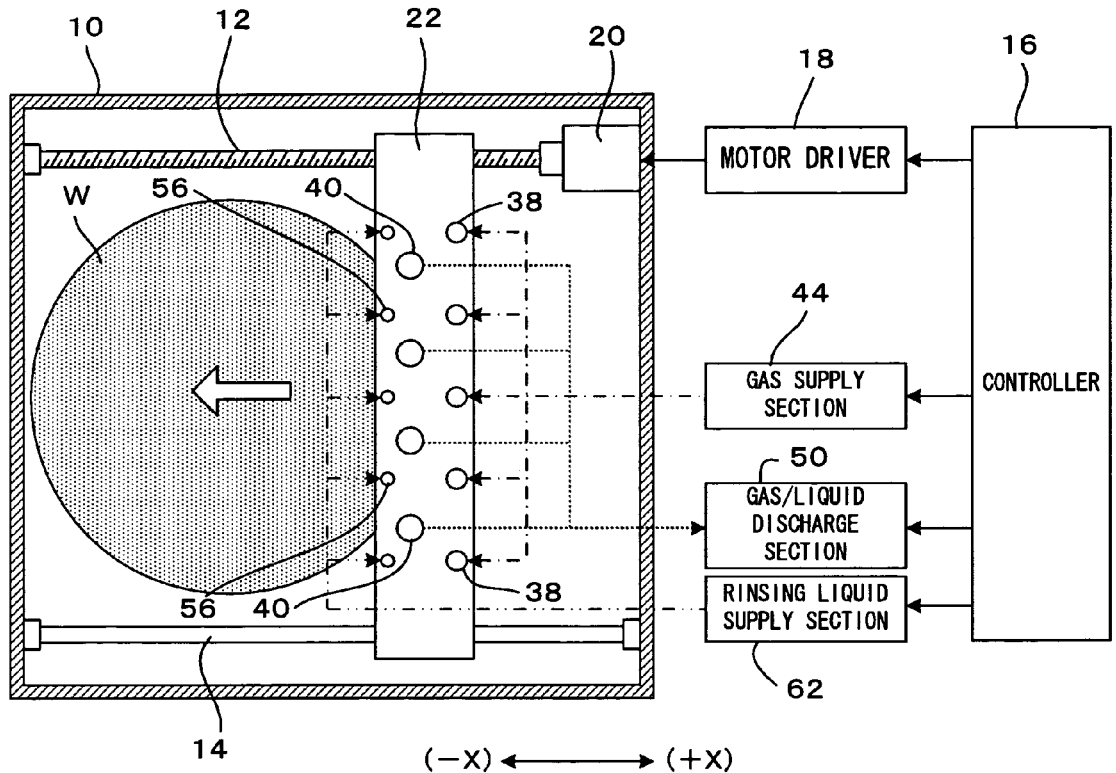
FIG. 5 is a plan view of a drying apparatus which represents a second embodiment of the invention.
Figure 6:
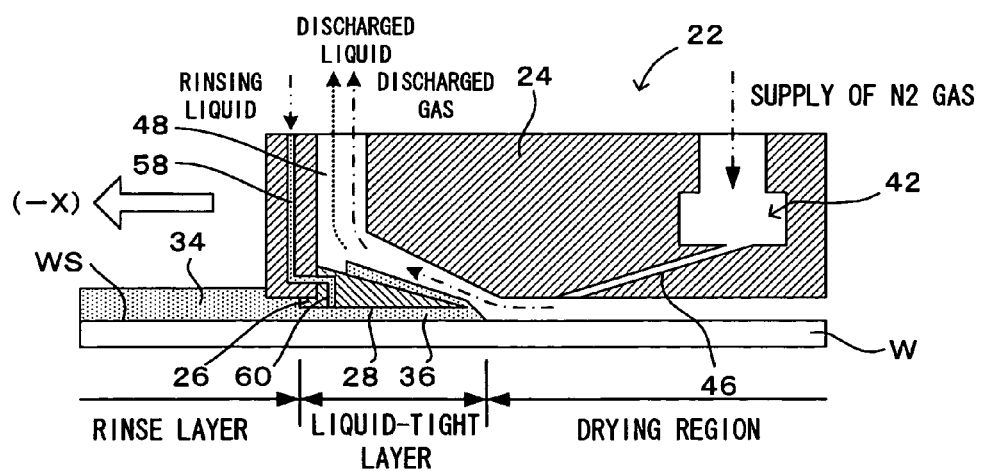
FIG. 6 is a partially expanded view of the drying apparatus of FIG. 5.

FIG. 5 is a plan view of a drying apparatus which represents a second embodiment of the substrate processing apparatus according to the invention. FIG. 6 is a partially expanded view of the drying apparatus shown in FIG. 5. More specifically, FIG. 6 is an enlarged cross sectional view of a drier head. A major difference of the drying apparatus 2 according to the second embodiment from the first embodiment lies in an additional structure (which corresponds to the "liquid supplier" of the invention) which supplies the rinsing liquid between the opposed surface 28 of the proximity member 26 and the substrate surface WS to form the liquid-tight layer 36. The other structures and operations are similar to those according to the first embodiment and therefore will be denoted at the same reference symbols but will not be described again.

In this embodiment, one or plural (five in the embodiment shown in FIG. 5) rinsing liquid supply ports 56 are further attached on the downstream-most side in the moving direction to the top surface of the drier head 22. These rinsing liquid supply ports 56 are communicated with a supply path 58 which is provided inside the head main body 24. The supply path 58 is connected with a supply path 60 which is provided inside the proximity member 26. A rinsing liquid supply section 62 operates in accordance with an operation command from the controller 16, and supplies an additional rinsing liquid to the space which is between the proximity member 26 and the substrate surface WS via the rinsing liquid supply ports 56 and the supply paths 58 and 60. With the rinsing liquid supplied as needed from the rinsing liquid supply section 62, the space which is between the proximity member 26 and the substrate surface WS is filled with the rinsing liquid, whereby the liquid-tight layer 36 is formed without fail stably. This is very effective particularly where it is difficult to form the liquid-tight layer 36 only by the capillary phenomenon.

Third Embodiment

Figure 7:
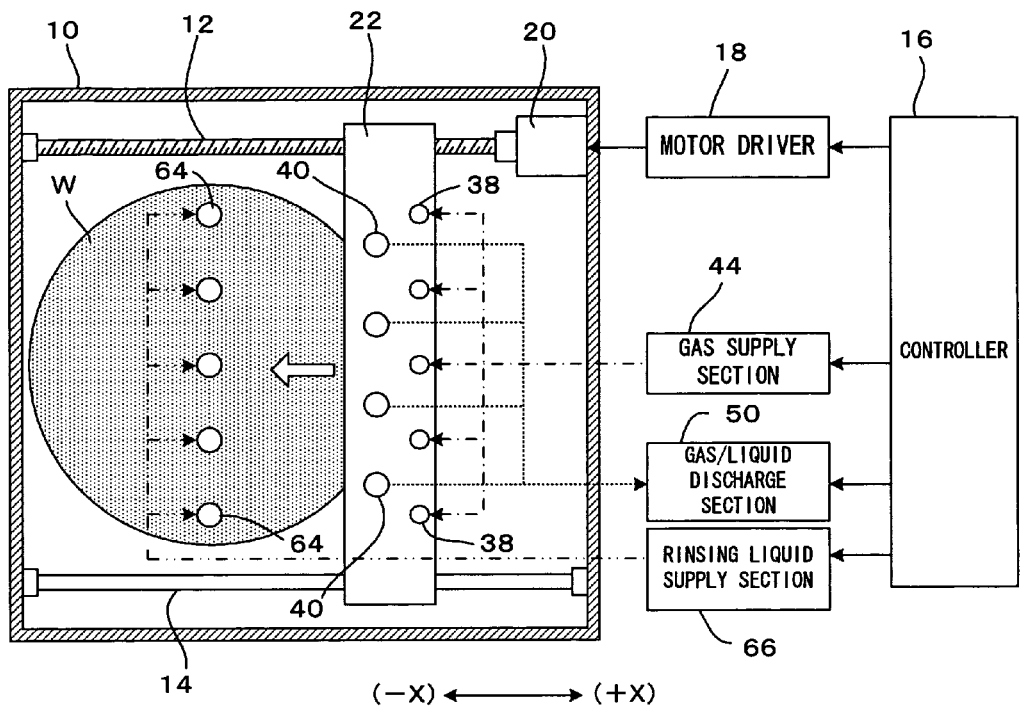
FIG. 7 is a plan view of a drying apparatus which represents a third embodiment of the invention.

FIG. 7 is a plan view of a drying apparatus which represents a third embodiment of the substrate processing apparatus according to the invention. In the third embodiment, there are one or plural (five in the embodiment shown in FIG. 7) nozzles 64 for a supply of rinsing liquid on the downstream side (−X) relative to the initial position (the far-right position in FIG. 7) of the drier head 22 in the moving direction, i.e., above the center of a substrate, which structure makes it possible to supply the rinsing liquid from a rinsing liquid supply section 66. When the rinsing liquid supply section 66 operates in accordance with an operation command from the controller 16, the rinsing liquid is discharged from the respective nozzles 64 toward the substrate surface WS and the substrate W is rinsed in the apparatus 2. Hence, it is possible to execute drying as in the case of the first embodiment, after rinsing in the same apparatus 2, whereby the time from the end of rinsing to the start of drying is shortened and the cleanliness of the substrate surface WS is enhanced. In this manner, the nozzles 64 and the rinsing liquid supply section 66 form the "rinsing liquid supplier" of the invention according to the third embodiment. The number, the locations and the like of the nozzles are not limited to this embodiment.

<Others>

Figure 8:
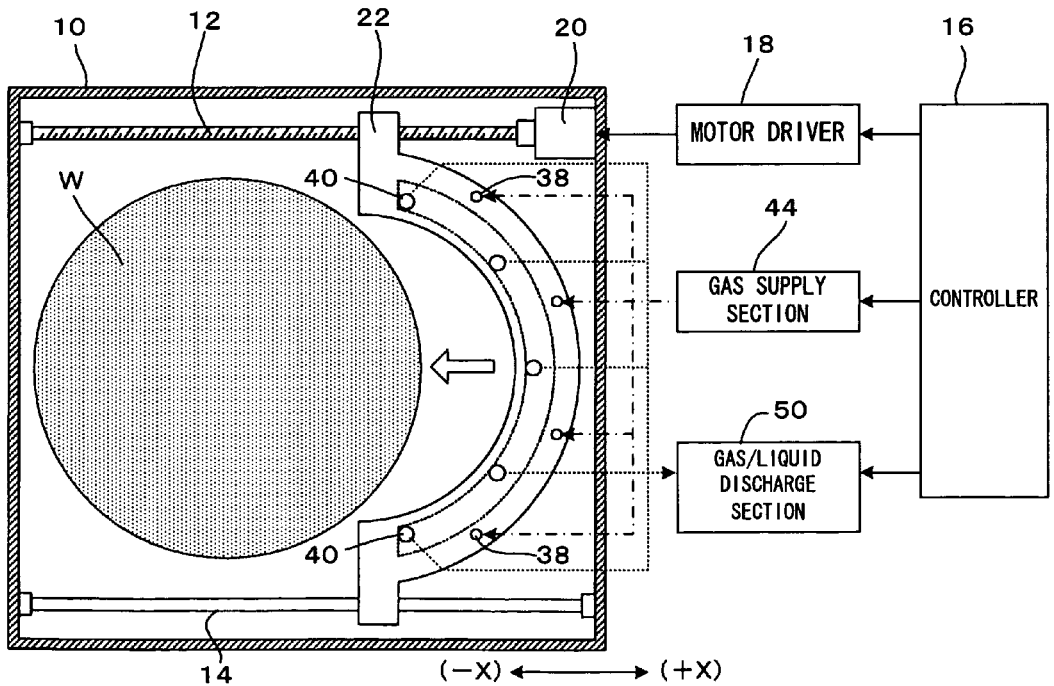
FIG. 8 is a plan view of other embodiment of the substrate processing system according to the invention.

The invention is not limited to the embodiments above but may be modified to the extent not deviating from the intention of the invention. For instance, in the embodiments above, the proximity member 26 has a shape of elongating rod of which the length is the same or longer than the substrate W in the direction approximately orthogonal to the moving direction X of the drier head 22, that is, the top-to-bottom direction in a plane of FIG. 2 for example. However, the outer shape of the proximity member 26 is not limited to this. Instead, the proximity member 26 may have a semi-circular shape which corresponds to the outer circumferential surface of the substrate W as shown in FIG. 8 for instance.

Further, in the embodiments above, although drying is executed while moving the proximity member 26 with the substrate W fixed, the substrate may also be moved at the same time. Further alternatively, the substrate W alone may be moved while maintaining the proximity member 26 fixed. The point is to secure relative movement of the proximity member 26 in the moving direction to the substrate W in a condition that the rinsing liquid fills up the space between the opposed surface 28, which is disposed off the substrate surface WS, and the substrate surface WS to form the liquid-tight layer 36.

Further, as for the shape of the proximity member 26, although the guide surface 30 is at the acute angle θ with respect to the opposed surface 28 according to the embodiments above, the shape of the proximity member 26 is not limited to this. A guide surface may be disposed which extends from the position of connection with the upstream side portion 32 (FIG. 3B) which defines the opposed surface 28 in a direction away from the substrate surface WS overlooking the upstream side (+X) in the moving direction, whereby the nitrogen gas and the rinsing liquid blown away by the nitrogen gas are discharged toward the gas/liquid discharge ports 40.

Further, although the proximity member 26 is made of quartz in the embodiments above, the invention is not limited to this. To favorably form the liquid-tight layer 36, the opposed surface 28 of the proximity member 26 is preferably made of a hydrophilic material. The guide surface 30 of the proximity member 26 as well, for efficient discharge of the liquid blown off from the substrate surface WS and the liquid-tight layer 36, is preferably made of a hydrophilic material.

Further, in the embodiments above, the distance between the proximity member 26 and the discharge position of the nitrogen gas (the tip end of the narrow tube part 46) is fixed, the invention is applicable also to an apparatus in which this distance changes as the proximity member 26 moves relative to the substrate W. However, when the flow rate of the nitrogen gas discharged from the tip end of the narrow tube part 46 is fixed, as the distance changes, the physical properties (the flow rate, the flow volume, etc.) of the nitrogen gas change and drying becomes instable. Noting this, in an apparatus in which the distance above changes, it is desirable that the controller 16 functions as the "gas flow rate controller" of the invention, i.e., that the controller 16 is structured so as to control the flow rate, the flow volume and the like of the nitrogen gas supplied from the gas supply section 44 and adjust the flow rate of the nitrogen gas discharged from the tip end of the narrow tube part 46. For instance, where nitrogen gas is discharged at a relatively low flow rate when the distance is short but at an enhanced flow rate as the distance grows, it is possible to stabilize the flow rate of the nitrogen gas (drying gas) which is blown against the exposed interface portion 52 and hence to perform stable and favorable drying.

Figure 10A:
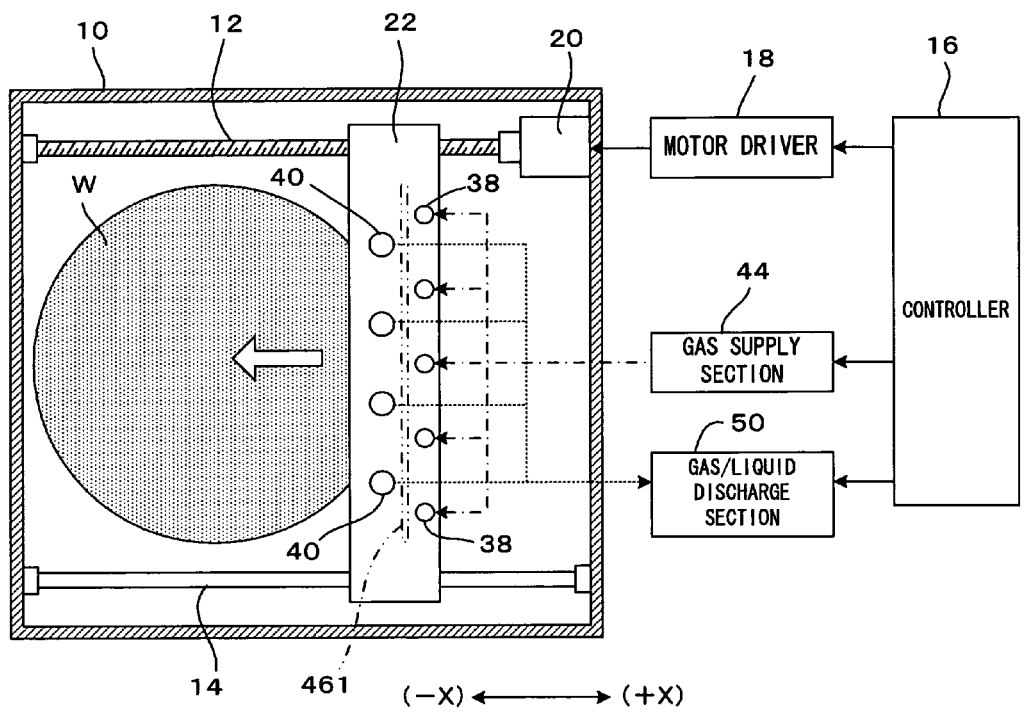
FIG. 10A is a plan view of a drying apparatus which represents still other embodiment of the invention.
Figure 10B:
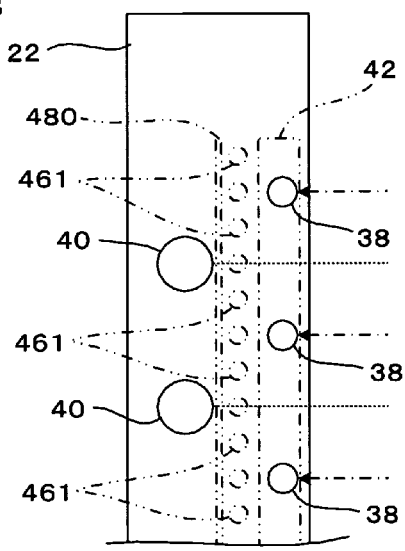
FIG. 10B is a partially expanded view of a drier head of FIG. 10A.

Further, in the embodiments above, although the discharge outlet 460 of the narrow tube part 46 has a shape of slit, the invention is not limited to this. The discharge outlet 460 may be formed as a lot of holes instead. More specifically, as shown in FIGS. 10A and 10B, the air reservoir 42 may be formed as a manifold with which plural narrow tube parts are communicated. It is noted that FIG. 10B is a partially enlarged view of FIG. 10A and shows the discharge outlets 461 of narrow tube parts which are communicated with the manifold 42 respectively. In this example, each of the discharge outlets 461 is preferably circular, the diameter of each of the discharge outlets 461 is preferably 0.5 mm, and each of the distances between the discharge outlets 461 is preferably from 1.5 mm to 2 mm. This better ensures uniform discharge of the nitrogen gas.

Figure 9:
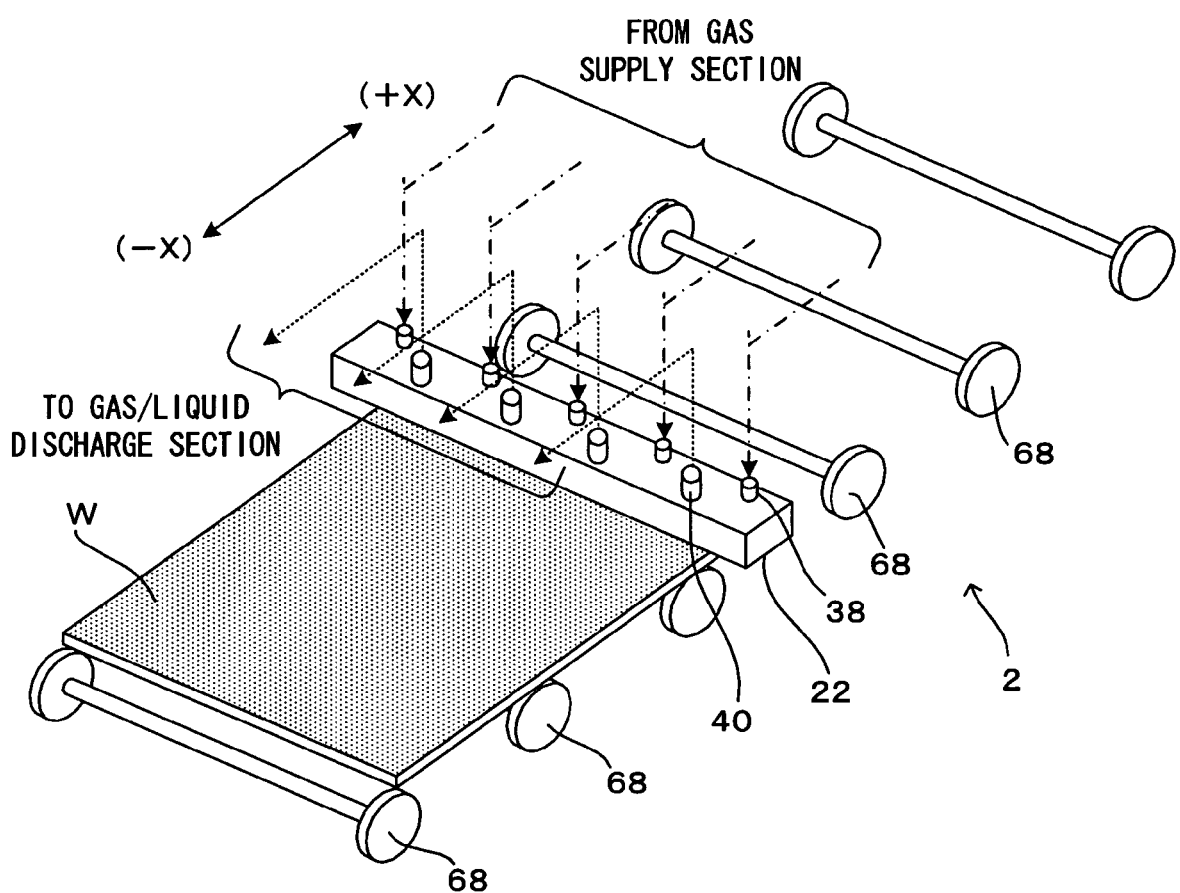
FIG. 9 is a perspective view of still other embodiment of the substrate processing system according to the invention.

Further, in the embodiments above, although drying is performed to the substrate W which is shaped approximately like a disk, the application of the substrate processing apparatus according to the invention is not limited to this. The invention is applicable also to a substrate processing apparatus which dries a surface of a rectangular substrate such as a glass substrate for liquid crystal display for example. As shown in FIG. 9 for instance, plural transportation rollers 68 corresponding to the "driver" of the invention may be disposed in a transportation direction (+X) and the drier head 22 having the identical structure to that according to the first embodiment may stay fixed while the transportation rollers 68 transport the substrate W. While the "predetermined moving direction" of the invention corresponds to the opposite direction (−X) to the transportation direction since the substrate W is transported in the transportation direction (+X) in this drying apparatus 2, a basic operation is exactly the same as that according to the embodiments above and similar effects to those according to the embodiments above are attained.

Further, although the drying apparatus 2 and the wet processing apparatus 1 are separated from each other in the embodiments above, these two may be disposed within the same apparatus. For instance, the drier head 22 may be incorporated within the wet processing apparatus 1 and the drier head 22 may scan over a rinsed substrate in the moving direction after completion of rinsing, to thereby perform drying in a similar manner to those according to the embodiments above.

Further, in the embodiments above, although drying is performed to the substrate W while moving the drier head 22 in the moving direction relative to the substrate W in a condition that the substrate surface WS to be dried is directed upward, the posture of the substrate is not limited to this.

Further, in the embodiments above, although drying is performed to the substrate surface WS which is wet with the rinsing liquid, the invention is applicable also to a substrate processing apparatus which dries the substrate surface which is wet with other liquid than the rinsing liquid.

The invention is applicable to a substrate processing apparatus which dries a surface of any general substrate which may be a semiconductor wafer, a glass substrate for photomask, a glass substrate for liquid crystal display, a glass substrate for plasma display, a substrate for an optical disk, etc.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus which dries a surface of a substrate which is wet with a liquid, comprising:

a proximity member which includes an opposed surface disposed facing the surface of the substrate but away from the surface of the substrate and which is structured to move freely and relatively to the substrate in a predetermined moving direction in a condition that a space between the opposed surface and the surface of the substrate is filled with said liquid to form a liquid-tight layer;

a driver which moves said proximity member relatively to the substrate in the moving direction; and a gas discharger which discharges a drying gas which dries the surface of the substrate, wherein said proximity member further includes a guide surface which is connected with an upstream side portion, which is located on the upstream side in the moving direction among side portions defining the opposed surface, and which extends from the position of connection with the upstream side portion in a direction away from the surface of the substrate overlooking the upstream side in the moving direction, and said gas discharger, in the moving direction, is disposed on the upstream side relative to said proximity member and discharges said drying gas toward an upstream-side interface of the liquid-tight layer.

2. The substrate processing apparatus of claim 1, wherein said proximity member is placed at such a position that the opposed surface and the surface of the substrate are close enough to each other to cause a capillary phenomenon in which the liquid enters an entire space between the surface of the substrate and the opposed surface and forms the liquid-tight layer.

3. The substrate processing apparatus of claim 1, further comprising a liquid supplier which is communicated with the space between the surface of the substrate and the opposed surface and which supplies the liquid into the space and fills up the space, whereby the liquid-tight layer is formed.

4. The substrate processing apparatus of claim 1, wherein while said proximity member moves relative to the substrate, a gap between said proximity member and the position at which the drying gas is discharged is maintained at a predetermined distance.

5. The substrate processing apparatus of claim 4, wherein said driver moves said proximity member and said gas discharger as one integrated unit such that said proximity member and said gas discharger remain away from each other over the distance.

6. The substrate processing apparatus of claim 5, wherein
said gas discharger includes a head main body inside which an air reservoir which is communicated with a gas supply section and a narrow tube part extending from the air reservoir to a surface of the head main body are disposed,
said proximity member is attached on the bottom surface side of the head main body and on the downstream side in the moving direction relative to the narrow tube part, and
said driver moves the head main body to which said proximity member is attached.

7. The substrate processing apparatus of claim 1, further comprising a gas flow rate controller, wherein
said gas discharger is fixed, whereas said proximity member is driven by said driver to move in the moving direction, and
said gas flow rate controller adjusts the flow rate of the drying gas discharged from said gas discharger in accordance with a gap between said proximity member and the position at which the drying gas is discharged.

8. The substrate processing apparatus of claim 1, wherein at an upstream-side end portion of said proximity member, the opposed surface and the guide surface are at an acute angle.

9. The substrate processing apparatus of claim 1, further comprising a rinsing liquid supplier which supplies a rinsing liquid to the surface of the substrate on a downstream side in the moving direction relative to said proximity member to perform rinsing of the substrate.

10. The substrate processing apparatus of claim 1, wherein the opposed surface of said proximity member is made of a hydrophilic material.

11. The substrate processing apparatus of claim 10, wherein the guide surface of said proximity member is made of a hydrophilic material.

12. The substrate processing apparatus of claim 11, wherein whole of said proximity member is made of quartz.

13. A substrate processing method of drying a surface of a substrate which is wet with a liquid, comprising the steps of:
arranging a proximity member which includes an opposed surface which faces the surface of the substrate and a guide surface to a position at which the opposed surface is away from the surface of the substrate, the guide surface being connected with an upstream side portion which is located on an upstream side in a predetermined moving direction among side portions defining the opposed surface and extending from the position of connection with the upstream side portion in a direction away from the surface of the substrate overlooking the upstream side in the moving direction;
forming a liquid-tight layer by filling up a space between the opposed surface and the surface of the substrate with the liquid;
moving said proximity member in the moving direction relative to the substrate while maintaining the condition that the liquid-tight layer is formed; and
discharging a drying gas to dry the surface of the substrate toward an upstream-side interface of the liquid-tight layer from the upstream side relative to said proximity member in the moving direction.

* * * * *